(12) United States Patent
Prasad

(10) Patent No.: US 6,195,344 B1
(45) Date of Patent: Feb. 27, 2001

(54) FORWARD-LINK TRAFFIC/PAGING-CHANNEL DE-INTERLEAVING FOR COMMUNICATION SYSTEMS BASED ON CLOSED-FORM EXPRESSIONS

(75) Inventor: Mohit K. Prasad, San Diego, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/042,397

(22) Filed: Mar. 13, 1998

(51) Int. Cl.[7] .................................................. H04J 13/00
(52) U.S. Cl. .......................... 370/335; 370/320; 370/441; 370/501; 370/342
(58) Field of Search ................... 370/335, 442, 370/332, 441, 295, 331, 203, 320, 209, 330, 311, 480, 204, 355, 342, 341, 350, 501; 455/428, 449, 447, 456, 522, 422; 714/2; 375/130, 134, 137

(56) References Cited

U.S. PATENT DOCUMENTS

| | | | |
|---|---|---|---|
| 4,199,660 | * 4/1980 | Dill et al. | 370/50 |
| 4,742,517 | * 5/1988 | Takagi et al. | 371/2 |
| 5,418,813 | 5/1995 | Schaffner et al. | 375/205 |
| 5,673,291 | 9/1997 | Dent | 375/262 |
| 5,675,344 | 10/1997 | Tong et al. | 342/457 |
| 5,812,543 | 9/1998 | Sugita | 370/335 |
| 5,946,356 | 8/1999 | Felix et al. | 375/295 |
| 5,949,796 | 9/1999 | Kumar | 370/529 |
| 6,005,855 | 12/1999 | Zehavi et al. | 370/335 |
| 6,064,664 | * 5/2000 | Kim | 370/335 |

OTHER PUBLICATIONS

"Realization of Optimum Interleavers", by John Ramsey, IEEE Transactions on Information Theory, vol. IT–16, No. 3, May 1970, pp. 337–345.

* cited by examiner

Primary Examiner—Dang Ton
Assistant Examiner—Anthony Ton
(74) Attorney, Agent, or Firm—Steven Mendelsohn

(57) ABSTRACT

De-interleaving of forward-link paging or traffic channels is performed by implementing closed-form expressions that are equivalent to the table-based processing specified in the cdmaOne telecommunication specification. The implementation can be in either hardware or software or a combination of both. For each cdmaOne forward-link paging or traffic channel, the closed-form expression relates each interleaved symbol position to a corresponding de-interleaved symbol position, which is used to generate a de-interleaved symbol stream from the interleaved symbol stream. In one hardware implementation, the forward-link de-interleaver of the present invention has an address generation unit made from two modulo counters.

21 Claims, 3 Drawing Sheets

FIG. 1A

| | | | | | | | | | | | | | | | |
|---|---|---|---|---|---|---|---|---|---|---|---|---|---|---|---|
| 1 | 25 | 49 | 73 | 97 | 121 | 145 | 169 | 193 | 217 | 241 | 265 | 289 | 313 | 337 | 361 |
| 2 | 26 | 50 | 74 | 98 | 122 | 146 | 170 | 194 | 218 | 242 | 266 | 290 | 314 | 338 | 362 |
| 3 | 27 | 51 | 75 | 99 | 123 | 147 | 171 | 195 | 219 | 243 | 267 | 291 | 315 | 339 | 363 |
| 4 | 28 | 52 | 76 | 100 | 124 | 148 | 172 | 196 | 220 | 244 | 268 | 292 | 316 | 340 | 364 |
| 5 | 29 | 53 | 77 | 101 | 125 | 149 | 173 | 197 | 221 | 245 | 269 | 293 | 317 | 341 | 265 |
| 6 | 30 | 54 | 78 | 102 | 126 | 150 | 174 | 198 | 222 | 246 | 270 | 294 | 318 | 342 | 366 |
| 7 | 31 | 55 | 79 | 103 | 127 | 151 | 175 | 199 | 223 | 247 | 271 | 295 | 319 | 343 | 367 |
| 8 | 32 | 56 | 80 | 104 | 128 | 152 | 176 | 200 | 224 | 248 | 272 | 296 | 320 | 344 | 368 |
| 9 | 33 | 57 | 81 | 105 | 129 | 153 | 177 | 201 | 225 | 249 | 273 | 297 | 321 | 345 | 369 |
| 10 | 34 | 58 | 82 | 106 | 130 | 154 | 178 | 202 | 226 | 250 | 274 | 298 | 322 | 346 | 370 |
| 11 | 35 | 59 | 83 | 107 | 131 | 155 | 179 | 203 | 227 | 251 | 275 | 299 | 323 | 347 | 371 |
| 12 | 36 | 60 | 84 | 108 | 132 | 156 | 180 | 204 | 228 | 252 | 276 | 300 | 324 | 348 | 372 |
| 13 | 37 | 61 | 85 | 109 | 133 | 157 | 181 | 205 | 229 | 253 | 277 | 301 | 325 | 349 | 373 |
| 14 | 38 | 62 | 86 | 110 | 134 | 158 | 182 | 206 | 230 | 254 | 278 | 302 | 326 | 350 | 374 |
| 15 | 39 | 63 | 87 | 111 | 135 | 159 | 183 | 207 | 231 | 255 | 279 | 303 | 327 | 351 | 375 |
| 16 | 40 | 64 | 88 | 112 | 136 | 160 | 184 | 208 | 232 | 256 | 280 | 304 | 328 | 352 | 376 |
| 17 | 41 | 65 | 89 | 113 | 137 | 161 | 185 | 209 | 233 | 257 | 281 | 305 | 329 | 353 | 377 |
| 18 | 42 | 66 | 90 | 114 | 138 | 162 | 186 | 210 | 234 | 258 | 282 | 306 | 330 | 354 | 378 |
| 19 | 43 | 67 | 91 | 115 | 139 | 163 | 187 | 211 | 235 | 259 | 283 | 307 | 331 | 355 | 379 |
| 20 | 44 | 68 | 92 | 116 | 140 | 164 | 188 | 212 | 236 | 260 | 284 | 308 | 332 | 356 | 380 |
| 21 | 45 | 69 | 93 | 117 | 141 | 165 | 189 | 213 | 237 | 261 | 285 | 309 | 333 | 357 | 381 |
| 22 | 46 | 70 | 94 | 118 | 142 | 166 | 190 | 214 | 238 | 262 | 286 | 310 | 334 | 358 | 382 |
| 23 | 47 | 71 | 95 | 119 | 143 | 167 | 191 | 215 | 239 | 263 | 287 | 311 | 335 | 359 | 383 |
| 24 | 48 | 72 | 96 | 120 | 144 | 168 | 192 | 216 | 240 | 264 | 288 | 312 | 336 | 360 | 384 |

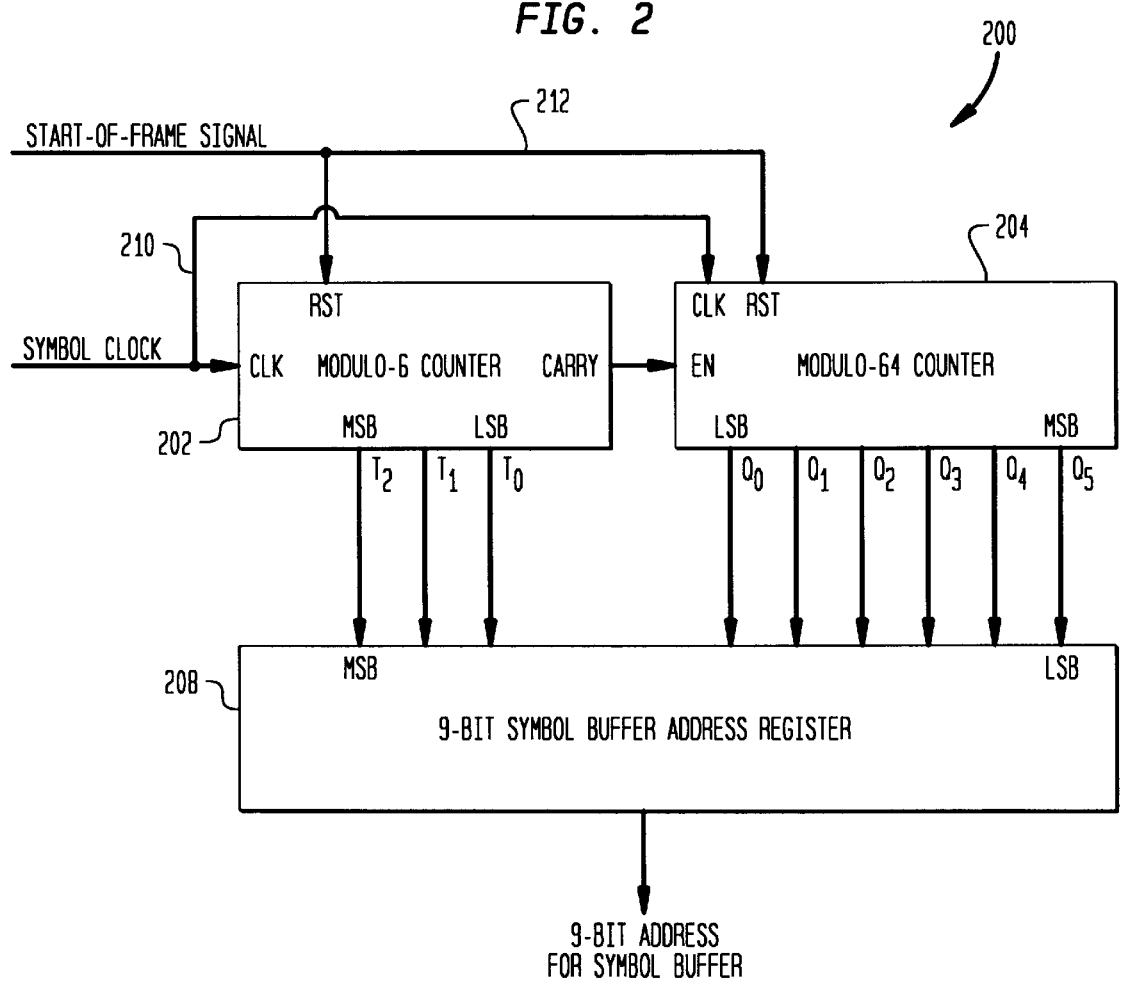

FORWARD-LINK TRAFFIC/PAGING-CHANNEL DE-INTERLEAVING FOR COMMUNICATION SYSTEMS BASED ON CLOSED-FORM EXPRESSIONS

CROSS-REFERENCES TO RELATED APPLICATIONS

This application is one of the following five U.S. patent applications filed on the same date: Ser. Nos. 09/039,151, 09/042,397, 09/039,157, 09/039,158, 09/039,154, the teachings of all of which are incorporated herein by reference.

BACKGROUND OF THE INVENTION

1. Field of the Invention

The present invention relates to telecommunication systems conforming to the cdmaOne standard.

2. Description of the Related Art

The cdmaOne™ communication standard is an interim standard for mobile telecommunication systems in which communications to and from each mobile unit are supported by one of a set of base stations strategically located over the system coverage area. The cdmaOne standard specifies a common air interface for code division multiple access (CDMA) systems on the cellular (900 MHz) and the PCS (1900 MHz) bands for mobile telephony. In addition, the same air interface is used for different wireless loop equipment supplied by a significant number of manufacturers. The term "cdmaOne" is used to refer collectively to the IS-95, IS-95A, and IS-95B family of communication standards.

The cdmaOne standard specifies that the symbols encoded in both the forward-link signal transmitted from the base station to the mobile unit and the reverse-link signal transmitted from the mobile unit to the base station be interleaved in the signal stream. Interleaving is performed to make burst errors during transmission look like random errors that are separated from one another in the de-interleaved symbol stream. In that case, the decoder in a receiver can perform error correction to reconstruct the original symbol stream notwithstanding the presence of burst errors.

According to the cdmaOne standard, a base station transmits forward-link data on a Pilot channel (used for timing acquisition), a Sync channel (used for synchronization) at 4800 bps, Paging channels at either 9600 or 4800 bps, and four Traffic (or Fundamental) channels at 9600, 4800, 2400, and 1200 bps. Each frame in a forward-link Paging or Traffic channel contains 384 symbols. At 9600 bps, each symbol occurs once per frame. At 4800 bps, each symbol occurs two times in a row; four times at 2400 bps; and eight times at 1200 bps. The data rates of 9600, 4800, 2400, and 1200 bps correspond to the set of four unpunctured rates under the cdmaOne standard referred to as Rate Set 1.

The cdmaOne standard also supports a second set of data rates referred to as Rate Set 2. In Rate Set 2, punctured convolutional codes are used to transmit data at 14400, 7200, 3600, and 1800 bps, corresponding to the unpunctured rates of 9600, 4800, 2400, and 1200 bps, respectively. By using punctured convolutional codes, the number of symbols per frame is maintained, and the interleaving structure for the four rates of Rate Set 2 is the same as the interleaving structure for the four rates of Rate Set 1.

Since only null data is sent on the Pilot channel, no interleaving is used on this channel. However, the cdmaOne specification does require interleaving for the rest of the forward-link channels.

For example, the cdmaOne standard specifies the forward-link interleaving process at the base station for the Paging and Traffic channels by means of a table. FIG. 1A shows the order in which the 384 symbols of each frame of un-interleaved forward-link Paging/Traffic data may be sequentially (or linearly) arranged within a matrix of 24 rows and 16 columns in the base station. The symbols are written columnwise, beginning with the first column on the left, successively from the top row to the bottom row.

Figure 1B:
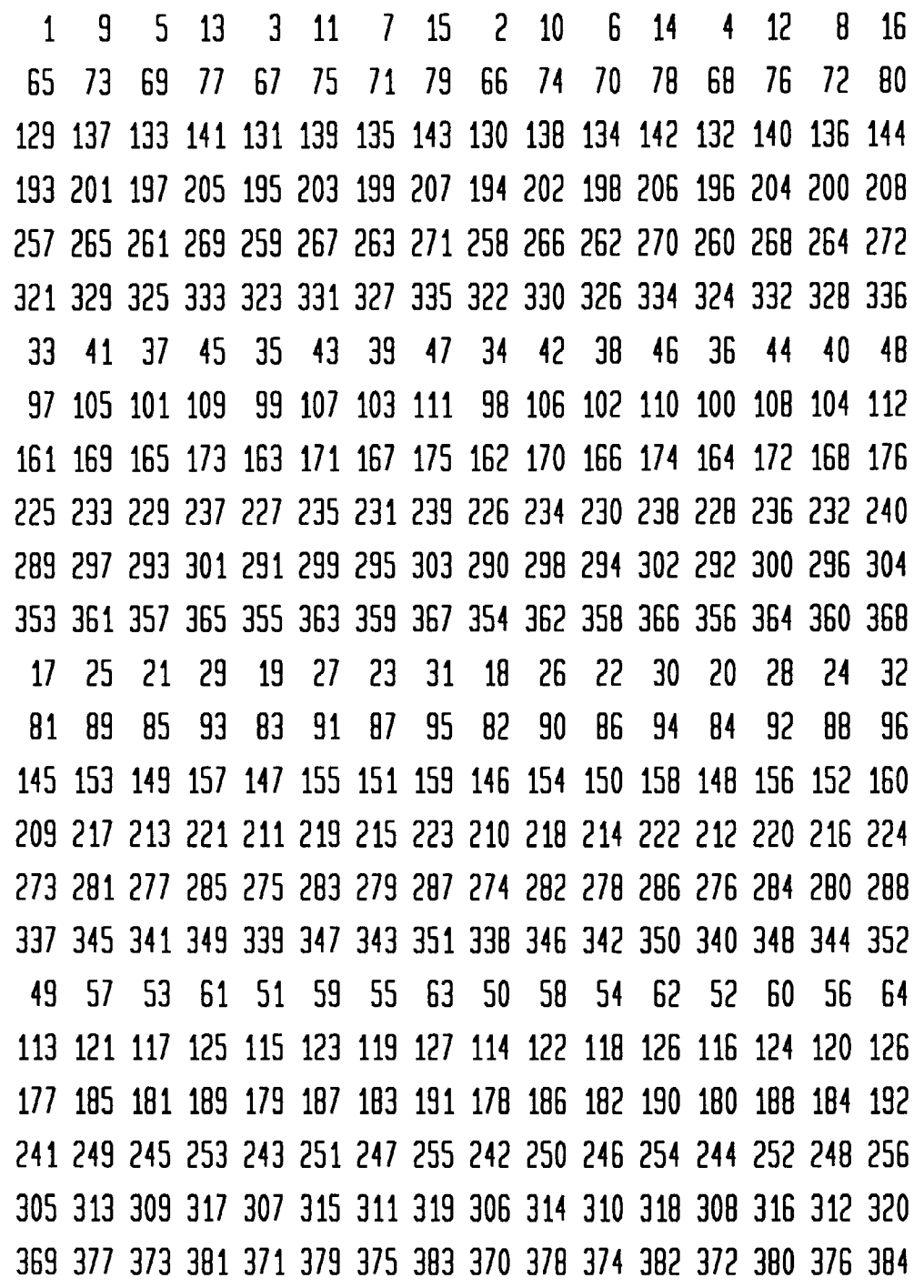

FIG. 1B shows the order in which the 384 symbols stored in the matrix of FIG. 1A are to be read in order to form a frame of interleaved forward-link Paging/Traffic data for the 9600-bps data rate. The sequence of symbols in FIG. 1B are listed columnwise, beginning with the first column on the left, successively from the top row to the bottom row. Thus, the symbol in position #1 in FIG. 1A is the first symbol in an interleaved frame, followed by the symbol in position #65, followed by the symbol in position #129, etc.

The interleaving scheme for the three other data rates (i.e., 4800, 2400, and 1200 bps) is identical to that shown in FIG. 1B for the 9600-bps data rate. The only difference is that, for the 4800-bps data rate, for example, the symbols stored in positions #1 and #2 in FIG. 1A correspond to the two occurrences of the first symbol in the frame, positions #3 and #4 correspond to the two occurrences of the second symbol in the frame, etc. Similarly, for the 2400-bps data rate, each set of four consecutive positions in FIG. 1A correspond to a different symbol in the frame, and, for the 1200-bps data rate, each set of eight consecutive positions in FIG. 1A correspond to a different symbol in the frame. The interleaving scheme for the different data rates in Rate Set 2 is identical to that for the corresponding data rates in Rate Set 1.

The de-interleaving process at the mobile unit must perform the reverse of these operations to recover a de-interleaved symbol stream for subsequent processing. Although the cdmaOne standard does not specify the de-interleaving process, typical existing telecommunication systems implement the reverse-link de-interleaving process by an algorithmic deconstruction of the interleaving process. This can be implemented at a reasonable cost only in software.

SUMMARY OF THE INVENTION

The present invention is directed to a de-interleaving process for cdmaOne mobile units in which the forward-link interleaved symbol stream is de-interleaved by hardware and/or software that implements closed-form expressions corresponding to the table-based procedures specified in the cdmaOne standard.

According to one embodiment, a closed-form expression relating each interleaved symbol position in an interleaved symbol stream to a corresponding de-interleaved symbol position is used to generate a de-interleaved symbol position for each symbol in the interleaved symbol stream. A de-interleaved symbol stream is generated from the interleaved symbol stream using the de-interleaved symbol positions.

In one hardware implementation, the present invention is an integrated circuit having a de-interleaver for de-interleaving a forward-link channel of a cdmaOne communication system. The de-interleaver comprises a symbol buffer and an address generation unit. The address generation unit is adapted to generate symbol addresses for reading interleaved symbols from or writing de-interleaved symbols to the symbol buffer. For each interleaved channel, the address generation unit implements a closed-form expression relating each interleaved symbol position to a corresponding de-interleaved symbol position to generate a de-interleaved symbol position for each symbol in the interleaved symbol stream.

BRIEF DESCRIPTION OF THE DRAWINGS

Other aspects, features, and advantages of the present invention will become more fully apparent from the following detailed description, the appended claims, and the accompanying drawings in which:

FIG. 1A shows the order in which the 384 symbols of each frame of un-interleaved forward-link Paging/Traffic data are arranged in a matrix of 24 rows and 16 columns during the interleaving operation in a cdmaOne base station;

FIG. 1B shows the order in which the 384 symbols stored in the matrix of FIG. 1A are to be read in order to form a frame of interleaved forward-link Paging/Traffic data; and FIG. 2 shows a block diagram of an address generation unit for a cdmaOne forward-link de-interleaver, according to one possible hardware embodiment of the present invention.

DETAILED DESCRIPTION

According to the present invention, the de-interleaving process applied to the forward-link stream of interleaved Paging/Traffic symbols received by a mobile unit from a base station in a cdmaOne telecommunication system corresponds to the implementation of closed-form expressions, rather than the table-based procedure of conventional cdmaOne systems. Depending on the particular embodiment, the closed-form expressions can be implemented in either hardware or software.

Closed-Form Expressions

This section presents closed-form expressions that relate the symbol positions in the interleaved stream to the symbol positions in the de-interleaved stream for the forward-link Paging and Traffic channels transmitted from the base stations to the mobile units of a cdmaOne telecommunication system. If $N_{IN}$ represents the symbol position in the interleaved stream and $N_{OUT}$ represents the symbol position in the de-interleaved stream, then a closed-form expression may be presented as follows:

$$N_{OUT} = F(N_{IN})$$

where F() represents the operations applied to the interleaved symbol position $N_{IN}$ to generate the de-interleaved symbol position $N_{OUT}$. The de-interleaved symbol position $N_{OUT}$ can be thought of as the buffer address for the de-interleaved symbol stream, where the buffer corresponds to a matrix located in the mobile unit that is equivalent to the base-station matrix shown in FIG. 1A.

For each frame, the symbols in the interleaved signal stream are counted sequentially from $N_{IN}$ equals 0 to 383. (Note that FIG. 1A shows the sequence of symbols running from 1 to 384, because this is how the interleaving patterns are specified in the cdmaOne standard.) As such, $N_{IN}$ can be represented by the 9-tuple $(c_8, c_7, c_6, c_5, c_4, c_3, c_2, c_1, c_0)$, where:

$$N_{IN} = 2^8 c_8 + 2^7 c_7 + 2^6 c_6 + 2^5 c_5 + 2^4 c_4 + 2^3 c_3 + 2^2 c_2 + 2 c_1 + c_0.$$

Two intermediate values $N_Q$ and $N_R$ are defined by Equations (1) and (2) as follows:

$$N_Q = N_{IN}/6 \quad (1)$$

and $$N_R = N_{IN} \text{ modulo } 6 \quad (2)$$

wherein $N_Q$ is the quotient (i.e., the integer portion when $N_{IN}$ is divided by 6) and $N_R$ is the remainder. Since 63 (i.e., 383/6) is the largest value for the quotient $N_Q$ and 5 is the largest value for the remainder $N_R$, these two intermediate values can be represented by the following 6-bit and 3-bit binary numbers, respectively:

$$N_Q = (q_5, q_4, q_3, q_2, q_1, q_0)$$

and $$N_R = (t_2, t_1, t_0)$$

where the $q_i$'s and $t_i$'s are binary values and $q_0$ is the least significant bits (LSB) in the 6-tuple $N_Q$ and $t_0$ is the LSB in the 3-tuple $N_R$, such that $$N_Q = 2^5 q_5 + 2^4 q_4 + 2^3 q_3 + 2^2 q_2 + 2 q_1 + q_0$$

and $$N_R = 2^2 t_2 + 2 t_1 + t_0.$$

The de-interleaved symbol position $N_{OUT}$ is given by the 9-tuple $(t_2, t_1, t_0, q_0, q_1, q_2, q_3, q_4, q_5)$, which is equivalent to Equation (3) as follows:

$$N_{OUT} = 2^8 t_2 + 2^7 t_1 + 2^6 t_0 + 2^5 q_0 + 2^4 q_1 + 2^3 q_2 + 2^2 q_3 + 2 q_4 + q_5. \quad (3)$$

In other words, the most significant bit (MSB) of the remainder $N_R$ becomes the MSB of the de-interleaved symbol position $N_{OUT}$, the second MSB of $N_R$ becomes the second MSB of $N_{OUT}$, and so on, and the LSB of the quotient $N_Q$ becomes the fourth MSB of $N_{OUT}$, the second LSB of $N_Q$ becomes the fifth MSB of $N_{OUT}$, and so on until the MSB of $N_Q$ becomes the LSB of $N_{OUT}$.

Equation (3) is a closed-form expression corresponding to the de-interleaving process applied by a mobile unit to the interleaved symbol stream of the forward-link Paging and Traffic channels transmitted by a base station in a cdmaOne telecommunication system. These closed-form expressions can be implemented in either hardware or software or even a combination of hardware and software.

Hardware Implementation

In one possible hardware implementation of the present invention, a forward-link de-interleaver in the mobile unit of a cdmaOne telecommunication system comprises an address generation unit and a symbol buffer. The symbol buffer contains a maximum of 384 symbols corresponding to a frame in the forward-link data stream. Unlike the transmitted symbols, which are only 1-bit wide, each decoded received symbol is soft and is represented by 2–6 bits depending on the requirements of the Viterbi decoder and the designer's discretion. Each decoded received symbol is synchronized by a symbol clock obtained from the tracker section of the Rake receiver. Each symbol is written into the symbol buffer at the address indicated by the output of the address generation unit (i.e., $N_{OUT}$).

FIG. 2 shows a block diagram of an address generation unit 200 for a cdmaOne forward-link de-interleaver, according to one possible hardware embodiment of the present invention. Address generation unit 200 receives a clock signal corresponding to the interleaved symbol position $N_{IN}$ for the current symbol in the current frame of the interleaved data stream and generates the appropriate corresponding de-interleaved symbol position $N_{OUT}$ for the specific data stream (i.e., either a Paging channel or a Traffic channel), which is used as the address for writing the symbol to the symbol buffer.

In particular, address generation unit 200 has a modulo-6 counter 202 and a modulo-64 counter 204, with the carry output of modulo-6 counter 202 connected to the enable input EN of modulo-64 counter 204. The symbol clock 210 is synchronized with the start-of-frame signal 212, with the two counters being reset to zero at the start of each frame. The 3-bit output of modulo-6 counter 202 feeds the MSBs of the 9-bit symbol buffer address register 208. When modulo-6 counter 202 rolls over, the carry bit is applied to the enable input of modulo-64 counter 204, thereby allowing modulo-64 counter 204 to increment. The 6-bit output of modulo-64 counter 204 is bit reversed to feed the LSBs of the 9-bit symbol buffer address register 208. That is, for example, the MSB of the 6-bit output from modulo-64 counter 204 feeds the LSB of the 9-bit symbol buffer address register 208. The resulting 9-bit address in register 208 is equal to the de-interleaved symbol position $N_{OUT}$ of Equation (3).

Although counters 202 and 204 are shown in FIG. 2 as being reset at the start of each frame, in general, the counters need only be reset at the start of the first frame and again at any other event that may require synchronization.

Although counter 204 is shown in FIG. 2 as a modulo-64 counter, since the start-of-frame signal is used as a reset signal for counter 204, counter 204 could be implemented as a "modulo-65" or higher counter instead of a modulo-64 counter. In general, the term "modulo-64 counter" as used in this specification may be interpreted as referring to any modulo-64 or higher counter, with the 6 LSBs of the counter output used to generate the address.

Although modulo-64 counter 204 is shown in FIG. 2 as being incremented by a combination of the carry bit from modulo-6 counter 202 and the symbol clock, in alternative embodiments of address generation unit 200, counter 204 can be incremented using a different scheme, for example, by applying the carry bit from counter 202 directly to the clock input CLK of counter 204 with counter 204 always enabled, without using the symbol clock as an additional input to counter 204.

As described, address generation unit 200 of FIG. 2 can be used to generate symbol buffer addresses to write decoded data into buffer locations corresponding to the de-interleaved sequence shown in FIG. 1A. In that case, after the buffer is filled, the de-interleaved data can be read sequentially from the memory for subsequent processing. This is an example of what is referred to as write-de-interleave-read-linear processing. Those skilled in the art will understand that address generation unit 200 of FIG. 2 can also be used to perform write-linear-read-de-interleave processing, in which the decoded data is written linearly into a symbol buffer and then read from the buffer using the buffer addresses generated by address generation unit 200 to yield the de-interleaved symbol stream for subsequent processing.

Although the present invention has been described in the context of one possible hardware implementation, it will be understood that other alternative hardware implementations corresponding to the closed-form expression of Equation (3) are also possible. Moreover, hardware embodiments can be implemented as part of an integrated circuit that also performs other mobile-unit functions. In addition, the expressions can be implemented in software or in a combination of hardware and software, as appropriate. Even if implemented entirely in software, embodiments corresponding to the closed-form expression of Equation (3) are simpler than the table-based algorithms of existing systems.

Although the present invention has been explained in the context of cdmaOne communication systems, it will be understood that the present invention can also be implemented in the context of communication systems conforming to standards other than the cdmaOne family of communication standards.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for de-interleaving a forward-link paging or traffic channel of a communication system, comprising the steps of:
   (a) receiving an interleaved symbol stream for the forward-link channel;
   (b) implementing a closed-form expression relating each interleaved symbol position to a corresponding de-interleaved symbol position to generate a de-interleaved symbol position for each symbol in the interleaved symbol stream, wherein the closed-form expression corresponds to two or more different sets of mathematical operations being applied to bits in a binary value representing each interleaved symbol position to generate bits in a binary value representing a corresponding de-interleaved symbol position; and
   (c) generating a de-interleaved symbol stream from the interleaved symbol stream using the de-interleaved symbol positions.

2. The method of claim 1, wherein: the closed-form expression is given by:

$$N_{OUT}=2^8 t_2+2^7 t_1+2^6 t_0+2^5 q_0+2^4 q_1+2^3 q_2+2^2 q_3+2 q_4+q_5$$

wherein:

$$N_Q=N_{IN}/6=(q_5,q_4,q_3,q_2,q_1,q_0)=2^5 q_5+2^4 q_4+2^3 q^3+2^2 q_2+2 q_1+q_0$$

$$N_R=N_{IN}\bmod 6=(t_2,t_1,t_0)=2^2 t_2+2 t_1+t_0$$

each element $q_{0-5}$ is an integer ranging from 0 to 1;
each element $t_{0-2}$ is an integer ranging from 0 to 1;
$N_{OUT}$ is the de-interleaved symbol position; and
$N_{IN}$ is the interleaved symbol position.

3. The method of claim 2, wherein the closed-form expression is implemented in software.

4. The method of claim 2, wherein the closed-form expression is implemented in hardware.

5. The method of claim 4, wherein the closed-form expression is implemented in a single integrated circuit.

6. The method of claim 5, wherein the hardware implementation comprises:
   (1) a modulo-6 counter adapted to generate the 3-tuple $(t_2,t_1,t_0)$ from the interleaved symbol position to generate the most significant bits of the de-interleaved symbol position; and
   (2) a modulo-64 or higher counter adapted to generate the 6-tuple $(q_5,q_4,q_3,q_2,q_1,q_0)$ based on the carry bit from the modulo-6 counter.

7. The method of claim 6, wherein the modulo-64 or higher counter generates the 6-tuple $(q_5,q_4,q_3,q_2,q_1,q_0)$ based on the carry bit from the modulo-6 counter and the interleaved symbol position.

8. A de-interleaver for de-interleaving a forward-link paging or traffic channel of a communication system, comprising:
   (a) means for receiving an interleaved symbol stream for the forward-link channel;

(b) means for implementing a closed-form expression relating each interleaved symbol position to a corresponding de-interleaved symbol position to generate a de-interleaved symbol position for each symbol in the interleaved symbol stream, wherein the closed-form expression corresponds to two or more different sets of mathematical operations being applied to bits in a binary value representing each interleaved symbol position to generate bits in a binary value representing a corresponding de-interleaved symbol position; and (c) means for generating a de-interleaved symbol stream from the interleaved symbol stream using the de-interleaved symbol positions.

9. The de-interleaver of claim 8, wherein: the closed-form expression is given by:

$$N_{OUT}=2^8 t_2+2^7 t_1+2^6 t_0+2^5 q_0+2^4 q_1+2^3 q_2+2^2 q_3+2 q_4+q_5$$

wherein:

$$N_Q=N_{IN}/6=(q_5,q_4,q_3,q_2,q_1,q_0)=2^5 q_5+2^4 q_4+2^3 q_3+2^2 q_2+2 q_1+q_0$$

$$N_R=N_{IN} \text{modulo } 6=(t_2,t_1,t_0)=2^2 t_2+2 t_1+t_0$$

each element $q_{0-5}$ is an integer ranging from 0 to 1;
each element $t_{0-2}$ is an integer ranging from 0 to 1;
$N_{OUT}$ is the de-interleaved symbol position; and
$N_{IN}$ is the interleaved symbol position.

10. The de-interleaver of claim 9, wherein the closed-form expression is implemented in software.

11. The de-interleaver of claim 9, wherein the closed-form expression is implemented in hardware.

12. The de-interleaver of claim 11, wherein the closed-form expression is implemented in a single integrated circuit.

13. The de-interleaver of claim 12, wherein the hardware implementation comprises:

(1) a modulo-6 counter adapted to generate the 3-tuple ($t_2,t_1,t_0$) from the interleaved symbol position to generate the most significant bits of the de-interleaved symbol position; and (2) a modulo-64 or higher counter adapted to generate the 6-tuple ($q_5,q_4,q_3,q_2,q_1,q_0$) based on the carry bit from the modulo-6 counter.

14. The de-interleaver of claim 13, wherein the modulo-64 or higher counter generates the 6-tuple ($q_5,q_4,q_3,q_2,q_1,q_0$) based on the carry bit from the modulo-6 counter and the interleaved symbol position.

15. An integrated circuit having a de-interleaver for de-interleaving a forward-link paging or traffic channel of a communication system, wherein the de-interleaver comprises:

(A) a symbol buffer; and (B) an address generation unit adapted to generate symbol addresses for reading interleaved symbols from or writing de-interleaved symbols to the symbol buffer, wherein the address generation unit implements a closed-form expression relating each interleaved symbol position to a corresponding de-interleaved symbol position to generate a de-interleaved symbol position for each symbol in an interleaved symbol stream, wherein the closed-form expression corresponds to two or more different sets of mathematical operations being applied to bits in a binary value representing each interleaved symbol position to generate bits in a binary value representing a corresponding de-interleaved symbol position.

16. The integrated circuit of claim 15, wherein: the closed-form expression is given by:

$$N_{OUT}=2^8 t_2+2^7 t_1+2^6 t_0+2^5 q^0+2^4 q_1+2^3 q_2+2^2 q_3+2 q_4+q_5$$

wherein:

$$N_Q=N_{IN}/6=(q_5,q_4,q_3,q_2,q_1,q_0)=2^5 q_5+2^4 q_4+2^3 q_3+2^2 q_2+2 q_1+q_0$$

$$N_R=N_{IN} \text{modulo } 6=(t_2,t_1,t_0)=2^2 t_2+2 t_1+t_0$$

each element $q_{0-5}$ is an integer ranging from 0 to 1;
each element $t_{0-2}$ is an integer ranging from 0 to 1;
$N_{OUT}$ is the de-interleaved symbol position; and
$N_{IN}$ is the interleaved symbol position.

17. The integrated circuit of claim 16, wherein the address generation unit comprises:

(1) a modulo-6 counter adapted to generate the 3-tuple ($t_2,t_1,t_0$) from the interleaved symbol position to generate the most significant bits of the de-interleaved symbol position; and (2) a modulo-64 or higher counter adapted to generate the 6-tuple ($q_5,q_4,q_3,q_2,q_1,q_0$) based on the carry bit from the modulo-6 counter.

18. The integrated circuit of claim 17, wherein the modulo-64 or higher counter generates the 6-tuple ($q_5,q_4,q_3,q_2,q_1,q_0$) based on the carry bit from the modulo-6 counter and the interleaved symbol position.

19. The method of claim 1, wherein the closed-form expression is implementable without relying on any lookup tables.

20. The de-interleaver of claim 8, wherein the closed-form expression is implementable without relying on any lookup tables.

21. The integrated circuit of claim 15, wherein the closed-form expression is implementable without relying on any lookup tables.

* * * * *